United States Patent
Kokubun

[19]

[11] Patent Number: 5,498,894
[45] Date of Patent: Mar. 12, 1996

[54] SEMICONDUCTOR DEVICE

[75] Inventor: Tetsuya Kokubun, Tokyo, Japan

[73] Assignee: NEC Corporation, Japan

[21] Appl. No.: 318,135

[22] Filed: Oct. 5, 1994

[30] Foreign Application Priority Data

Oct. 8, 1993 [JP] Japan ................................. 5-253008

[51] Int. Cl.[6] .......................... H01L 27/01; H01L 27/12; H01L 31/0392; H01L 29/76
[52] U.S. Cl. ........................... 257/349; 257/345; 257/354
[58] Field of Search ..................................... 257/354, 345, 257/349, 400, 395, 396, 397, 398

[56] References Cited

U.S. PATENT DOCUMENTS 5,192,993  3/1993  Arai et al. ............................... 257/400

FOREIGN PATENT DOCUMENTS 62-250671  10/1987  Japan .
4290471  10/1992  Japan ..................................... 257/400

Primary Examiner—Stephen D. Meier
Attorney, Agent, or Firm—Ostrolenk, Faber, Gerb & Soffen

[57] ABSTRACT

On a semiconductor substrate (1), there are provided field oxide films (2,3,4), a gate oxide film (5), thin oxide films (6, 6) with film thickness almost equal to that of the gate oxide film (5), and a gate electrode (7). An oxide film (8) of the same thickness as the gate oxide film (5) is also provided so as to separate the field oxide films (3) and (4), to overlap a portion of the gate electrode (7). A high-concentration impurity layer (11, 12) is formed under each of the thin oxide films (6, 8). Source-drain areas (9, 10) are provided with end portions separated from the high-concentration impurity layer (12) and the field oxide films (3, 4).

3 Claims, 6 Drawing Sheets

5,498,894

SEMICONDUCTOR DEVICE

BACKGROUND OF THE INVENTION

Field of the Invention

The present invention relates to a semiconductor device, particularly to a semiconductor device comprising: a device area formed on a semiconductor substrate consisting of a gate insulating film, source-drain areas and a gate electrode; and a device separation area composed of a thick insulating film, a first thin insulating film with film thickness almost equal to that of the gate insulating film and a first high-concentration impurity layer provided under the first thin insulating film.

Description of the Related Art

When an MOS transistor receives ionizing radiation such as gamma rays, the increase in accumulation of the fixed positive charge in a silicon oxide film and increase of the interface state density of the interface between the oxide film and silicon cause deterioration of the characteristics of the MOS transistor such as threshold voltage shifts or increase in leakage current. It is known that the thicker the oxide film, the more the amount of accumulation of the fixed positive charge. Therefore, an inversion layer caused by an electric field of fixed positive charge more readily forms on the surface of a P-type semiconductor substrate placed under a thick field oxide film than for a case in which the substrate is placed under a thin gate oxide film. Leakage currents that flow between a source and a drain under the end portion of the gate of an NMOS transistor, leakage currents between adjacent NMOS transistors, or leakage currents between an NMOS transistor and an N-well are caused by parasitic transistors which form through the thick field oxide film. This causes serious problems for the semiconductor devices to be used in a space environment.

Of these types of leakage currents, the prevention of the leakage currents that flow between the source and drain under the end portion of a gate is attempted in a semiconductor device having the structure shown in FIGS. 1a, 1b, 1c and 1d (Japanese Patent Laid-open No. 87-250671). Here, FIG. 1a is a view showing a plan of a conventional example of an NMOS transistor, and FIGS. 1b, 1c and 1d are sectional views taken along line B—B, line C—C and line D—D, respectively, of FIG. 1a. The conventional example of the NMOS transistor will be described below with reference to these drawings.

On the surface of a P-type semiconductor substrate 21, there are provided field oxide films 22, 23 and 24 (represented by hatched portions in FIG. 1a). On the surface of the substrate 21 within a device area enclosed by the field oxide films 23 and 24, a thin gate oxide film 25 is formed. An oxide film 26 having film thickness equal to that of the gate oxide film 25 is formed between the field oxide films 22 and 23, and another similar oxide film 26 is also formed between the field oxide films 22 and 24. A gate electrode 27 is formed in such a way that both ends reach the oxide films 26, and under the end portions of the gate electrode 27, a thin oxide film 28 having the same film thickness as the gate oxide film 25 is provided so as to connect the oxide films 25 and 26. Within the area enclosed by the field oxide films 23 and 24, $N^+$-type source-drain areas 29, 30 are formed using the gate electrode 27 as a mask of ion implantation. Further, under the oxide film 26, a $P^{++}$-type high-concentration impurity layer 31 is formed in a self-aligned configuration with reference to the gate electrode 27.

With this conventional structure, since a thin oxide film 28 with the same thickness as gate oxide film 25 is provided under the gate electrode 27, it is possible to suppress the increase of the leakage current which is caused by radiation generated between the source-drain areas 29, 30 shown by arrows in FIG. 1a.

Further, when this conventional structure is applied to a CMOS transistor, latch-up phenomenon triggered by penetration of a high-energy particle can be limited by connecting the $P^{++}$-type high-concentration impurity layer 31 to a ground wire to get the same electric potential as source area 29 or 30,.

The above semiconductor device of the conventional structure exhibits sufficient resistance to radiation if the gate length of the transistor is relatively long, for example, if the gate length is approximately 2 μm. However, if the above structure is applied to a recent device which has a gate length in the submicron range, the following problem occurs.

When the gate length of the device is short, and particularly when it is 1 μm or less and this device is applied to realize the structure of FIGS. 1a, 1b, 1c, 1d, the field oxide films 23, 24 are disposed too close to each other on both ends of the oxide film 28. As a result, depletion layers or inversion layers, which are produced under the field oxide films 23, 24 by the accumulated fixed positive charge when the device is irradiated such as when used in space, form in an overlapping configuration, thereby causing leakage currents to flow between the source and drain as shown by arrows in FIG. 1a.

SUMMARY OF THE INVENTION

An object of the present invention is to provide a semiconductor device free from leakage currents generated between a source and a drain even when the gate length of the semiconductor device is short and the device is subjected to radiation such as when used in space.

In order to achieve the above object, the semiconductor device of the present invention comprises: a device area formed on a semiconductor substrate consisting of a gate insulating film, source-drain areas and a gate electrode; and a device separation area composed of a thick insulating film, a first thin insulating film with film thickness almost equal to that of the gate insulating film and a first high-concentration impurity layer provided under the first thin insulating film; and further includes a second thin insulating film that partially overlaps the gate electrode at the end of the gate electrode and is connected with the first thin insulating film; and a second high-concentration impurity layer provided under the second thin insulating film so as to be separated from the source-drain areas connected with the first high-concentration impurity layer.

The semiconductor device of the present invention also comprises a third high-concentration impurity layer provided between the second high-concentration impurity layer and the source-drain areas, the third high-concentration impurity layer having impurity concentration higher than that of the semiconductor substrate and lower than that of the second high-concentration impurity layer.

Further, the semiconductor device of the present invention comprises first and second thin insulating films which are thicker than the gate oxide film.

The novel features that characterize the invention are set forth with particularity in the appended claims. The invention itself, however, and additional objects and advantages thereof, will best be understood from the following descrip-

BRIEF DESCRIPTION OF THE DRAWINGS

FIG. 4b is a sectional view taken along line B—B of FIG. 4a.

DESCRIPTION OF THE PREFERRED EMBODIMENTS

Figures 1A, 1B, 1C, 1D:
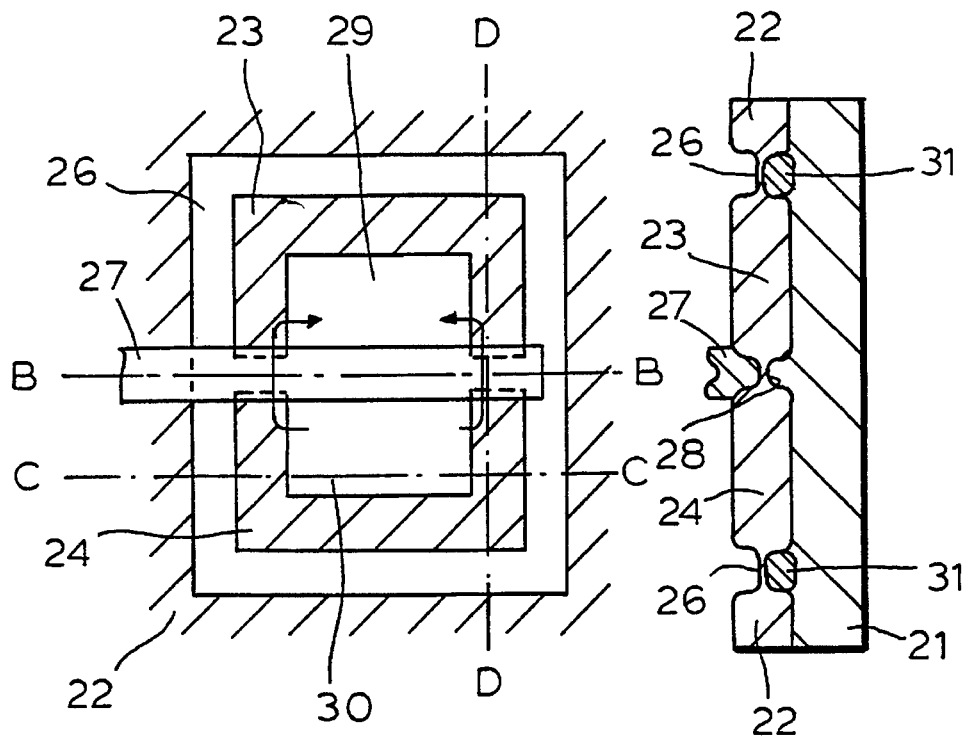
FIG. 1a is a plan of an example of a semiconductor device of a conventional type.
FIG. 1b, FIG. 1c, and FIG. 1d are sectional views taken along line B—B, line C—C, and line D—D of FIG. 1a, respectively.
Figures 2A, 2D:
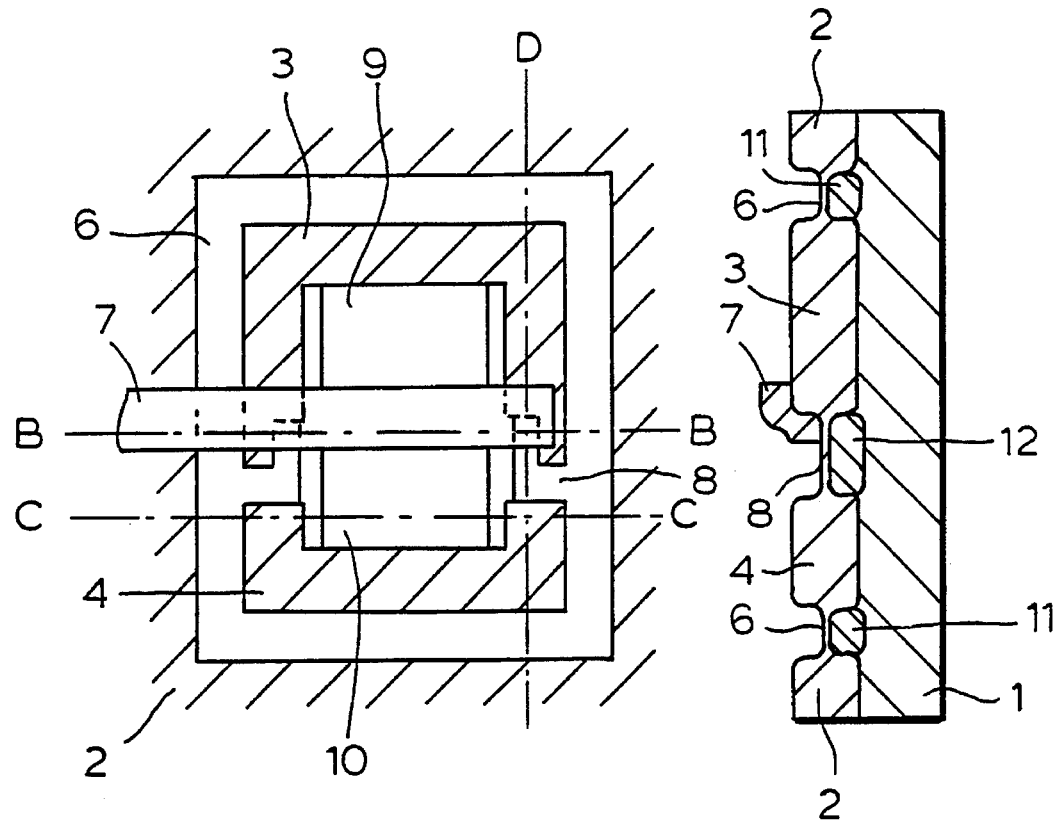
FIG. 2a is a plan of a first embodiment of a semiconductor device of the present invention.
FIG. 2b, FIG. 2c, and FIG. 2d are sectional views taken along line B—B, line C—C, and line D—D of FIG. 2a, respectively.
Figure 2B:
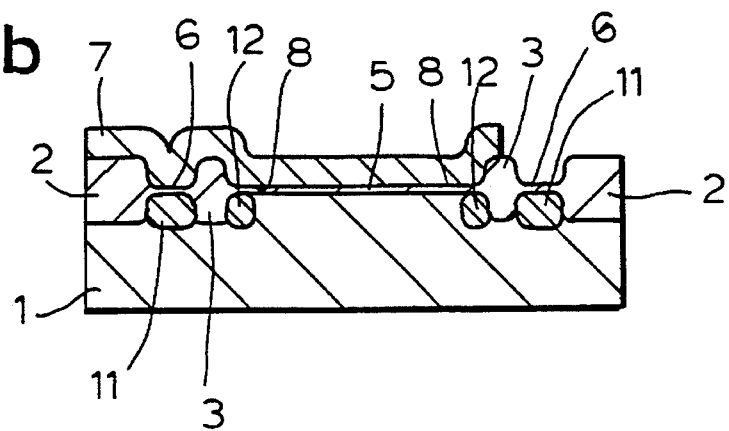
Figure 2C:
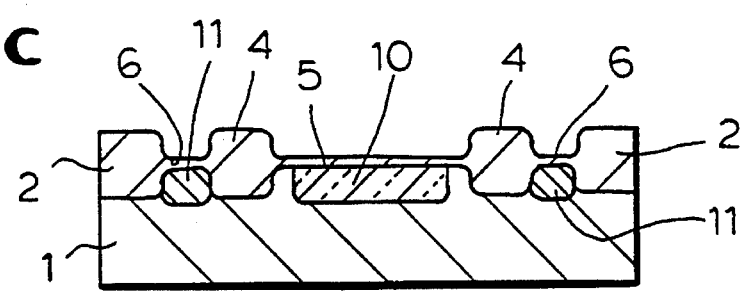

A first embodiment of a semiconductor device of the present invention will be described with reference to FIGS. 2a, 2b, 2c and 2d.

This semiconductor device is an NMOS transistor in which field oxide films 2, 3, 4 having film thickness approximately in the range of 400 to 600 nm are provided on the surface of a P-type semiconductor substrate 1. On the surface of the semiconductor substrate 1 disposed within a device area surrounded by the field oxide films 3 and 4, there is formed a gate oxide film 5 with a film thickness of about 10 to 20 nm. A thin oxide film 6 with a film thickness similar to that of the gate oxide film 5 is provided between the field oxide films 2 and 3, and another similar oxide film 6 is provided between the oxide films 2 and 4. On the gate oxide film 5, there is provided a gate electrode 7. Between the field oxide films 3 and 4 located within a device separation area, a thin oxide film 8 having a film thickness similar to that of the gate oxide film 5 is provided in an L-shaped form in such a manner that it overlaps with the end of the gate electrode 7. The field oxide films 3 and 4 are sufficiently separated by the oxide film 8 not directly under the gate electrode 7 but at a distance from the gate electrode 7. $P^{++}$-type high-concentration impurity layers of very high concentration 11, 12 are formed under the thin oxide films 6 and 8, respectively. These high-concentration impurity layers 11, 12 can be made by including, for example, about $10^{19}$ to $10^{20}$ cm$^{-3}$ of boron. Within an area enclosed by the field oxide films 3, 4 and the oxide film 8, $N^+$-type source-drain areas 9, 10 are formed using the gate electrode 7 as a mask. Here, end portions of the source-drain areas 9, 10 in the width direction of the gate are formed such that they are kept separate from the $P^{++}$-type high-concentration impurity layer 12 or the field oxide films 3 and 4. Between the end portions of the source-drain areas 9, 10 and the $P^{++}$-type high-concentration impurity layer 12, there are spaces of approximately 1.0 μm.

The $P^{++}$-type high-concentration impurity layer 11 is connected with a ground wire through a contact (not shown).

In this semiconductor device, since the field oxide films 3 and 4 are sufficiently separated and the $P^{++}$-type high-concentration impurity layer 12 is formed under the oxide film 8, no route are formed by which leakage currents may pass between the source and drain. In fact, an NMOS transistor with the same structure as the above embodiment with gate length of 1.0 μm and gate width of 13 μm was manufactured for experimentation and was subjected to a gamma ray irradiation test using 60Co. Results showed that the leakage current between the source and drain was limited to $10^{-14}$ ampere or less even when the total gamma ray dose reached $1 \times 10^4$ Gy (Si) and a voltage of 5 V was impressed on the drain. It was also confirmed that these results could be obtained regardless of the presence of a gate bias voltage applied during the gamma ray irradiation.

Further, since the $P^{++}$-type high-concentration impurity layer 12 and the source-drain areas 9, 10 are formed so as not to contact each other, a $P^{++}$-type high-concentration impurity layer 12 can be formed without lowering the breakdown voltage of PN junction. Here, since the L-shaped thin oxide film 8 need only overlap with a part of one side of the gate electrode 7, there is no difficulty in manufacturing the film even when the length of the gate electrode is short. Also, the increase of the parasitic capacity caused by overlapping of the oxide film 8 and the gate electrode 7 can be kept at a minimum. Further, since the $P^{++}$-type high-concentration impurity layer 12 is grounded. through the high-concentration impurity layer 11, it is unlikely that a latch-up phenomenon will occur in case of CMOS configuration. Inasmuch as the $P^{++}$-type high-concentration impurity layer prevents leakage currents between itself and other neighboring devices, it can be said that the present embodiment has a structure in which resistance to radiation is synthetically strengthened.

Figure 3:
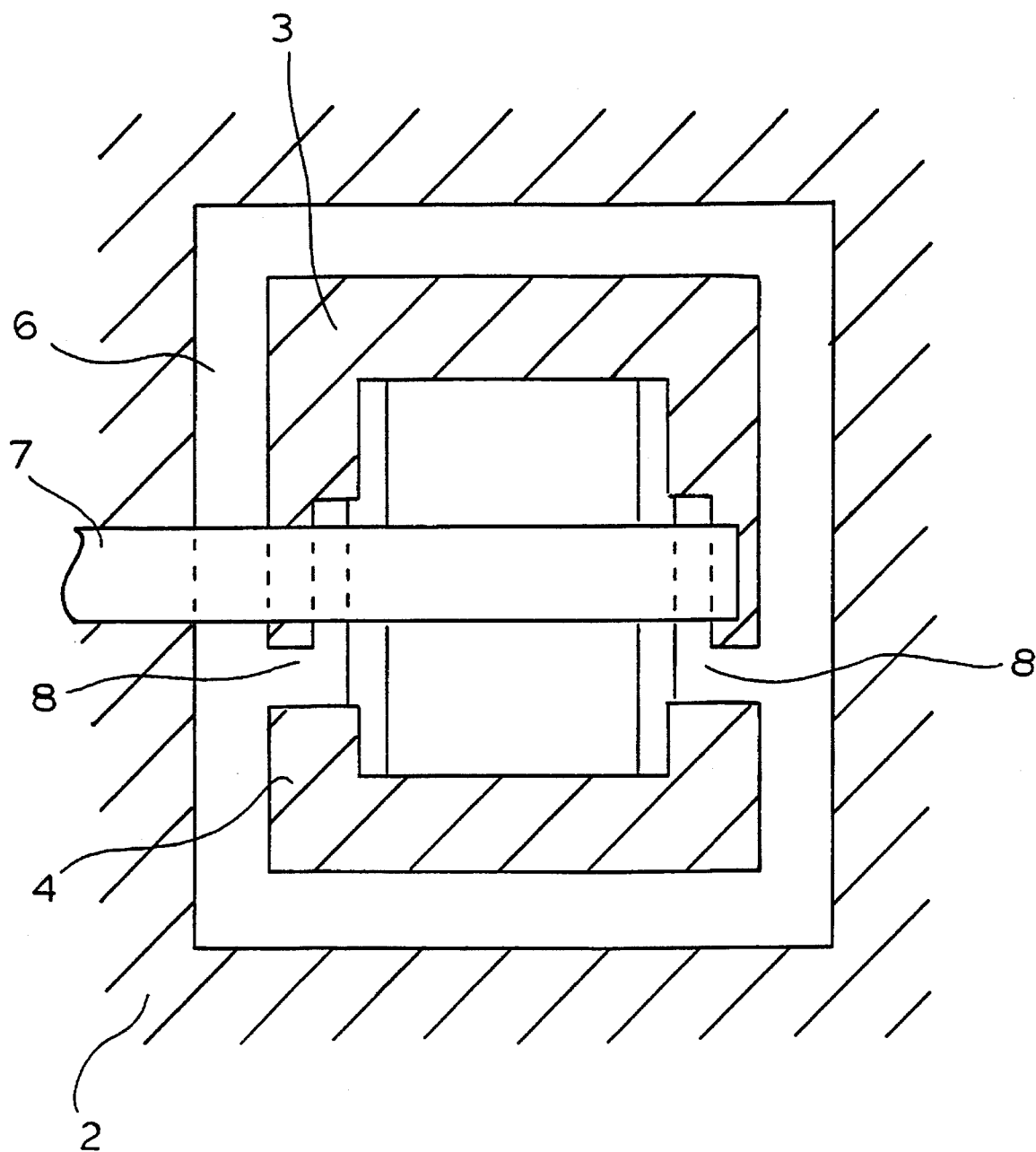
FIG. 3 is a plan of a second embodiment of the semiconductor device of the present invention.

A second embodiment of the present invention will next be described with reference to FIG. 3.

This semiconductor device is an NMOS transistor as shown in FIGS. 2a, 2b, 2c, 2d in which L-shaped thin oxide films 8 are provided so as to cross the gate electrode 7. With this type of structure, since no offset of alignment and no influence thereby will be produced in the photoresist process at the time of manufacturing, the radiation resistance thereof can be improved with certainty. However, in this case, the parasitic capacity is increased between the gate electrode 7 and the semiconductor substrate 1, and hence the switching speed of the semiconductor device is not as good as that produced by the structure of FIGS. 2a, 2b, 2c, 2d. Therefore, the overlapping area of the gate electrode 7 and the oxide film 8 can be optimized depending on the required switching speed and radiation resistance.

Next, a third embodiment of the semiconductor device of the present invention will be described with reference to FIGS. 4a, 4b, 4c and 4d.

Figure 4A:
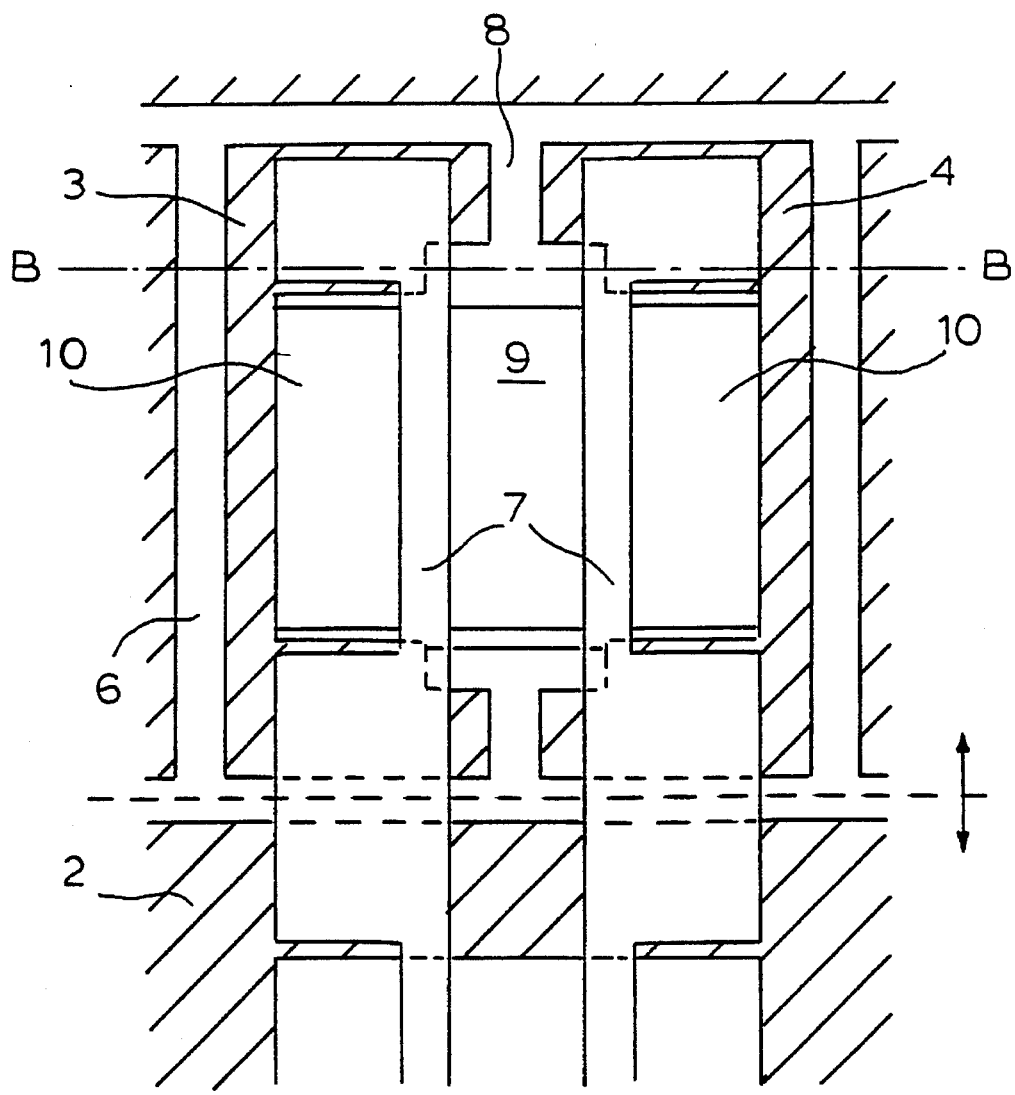
FIG. 4a is a plan of a third embodiment of the semiconductor device of the present invention.
Figure 4B:
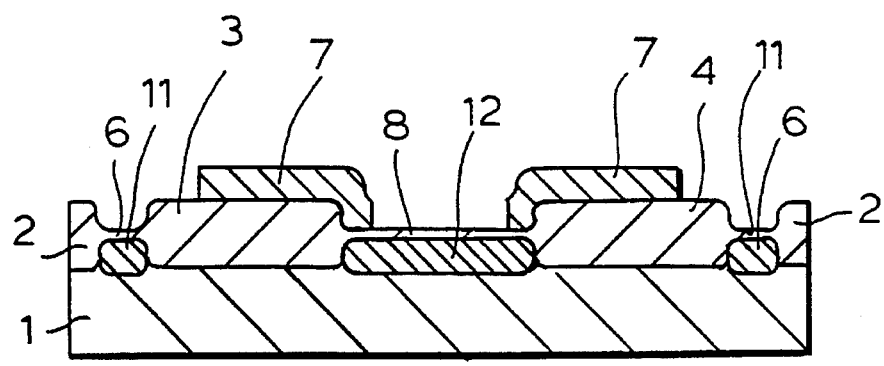
Figure 5A:
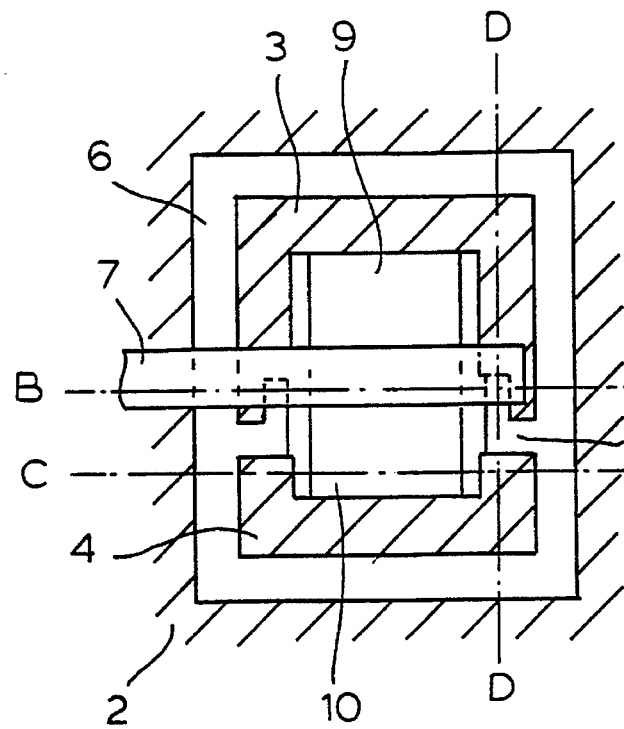
FIG. 5a is a plan of a fourth embodiment of the semiconductor device of the present invention.
Figure 5D:
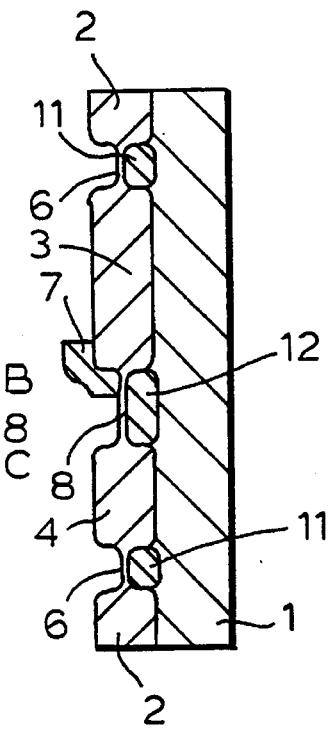
FIG. 5b, FIG. 5c, and FIG. 5d are sectional views taken along line B—B, line C—C, and line D—D of FIG. 5a, respectively.
Figure 5B:
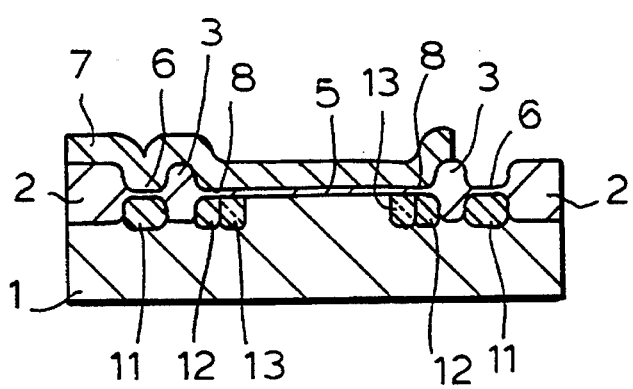
Figure 5C:
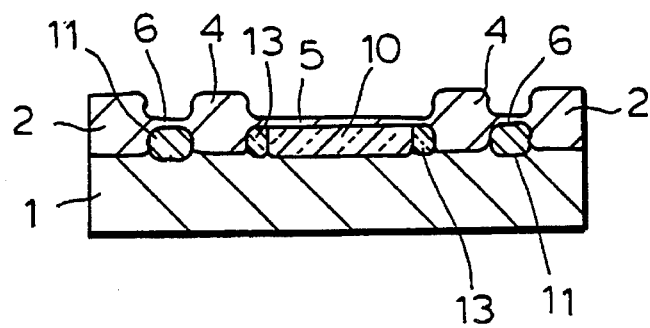
Figure 6A:
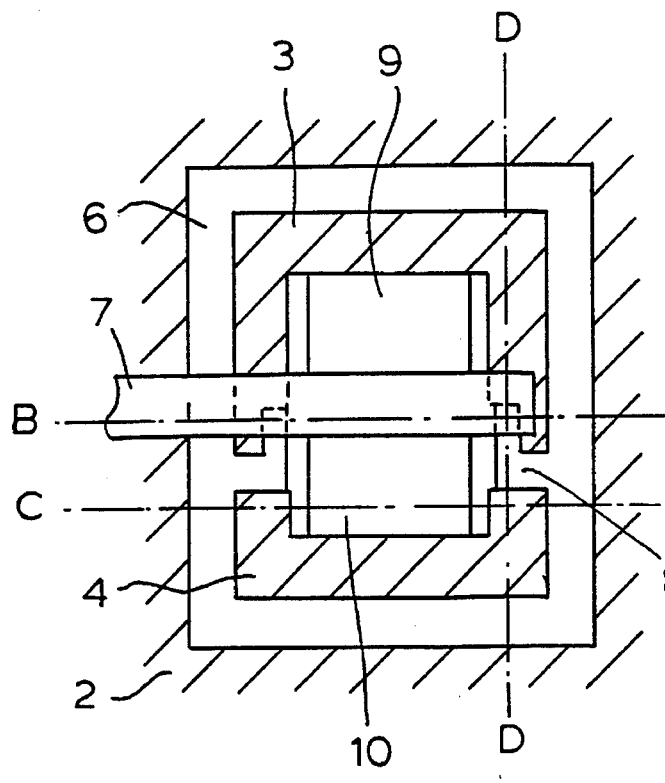
FIG. 6a is a plan of a fifth embodiment of the semiconductor device of the present invention.
Figure 6D:
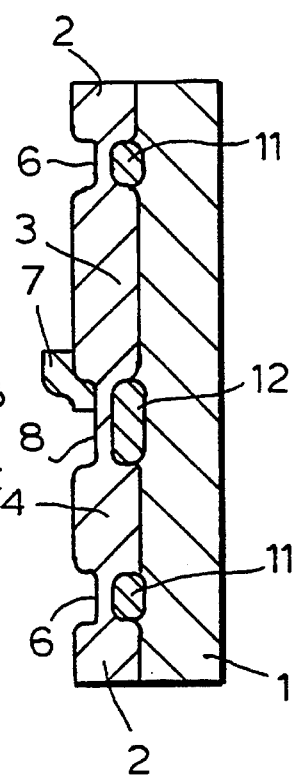
FIG. 6b, FIG. 6c, and FIG. 6d are sectional views taken along line B—B, line C—C, and line D—D of FIG. 6a, respectively.
Figure 6B:
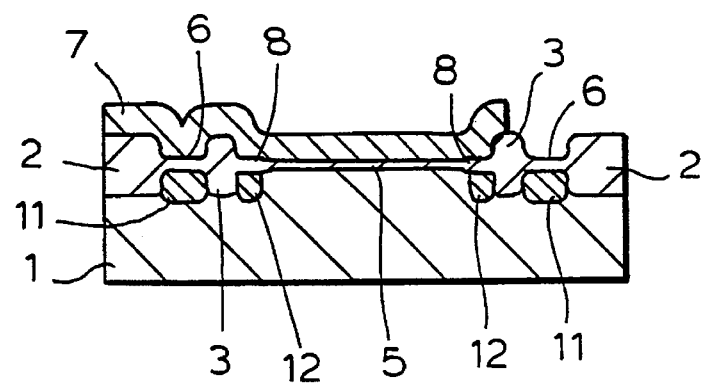
Figure 6C:
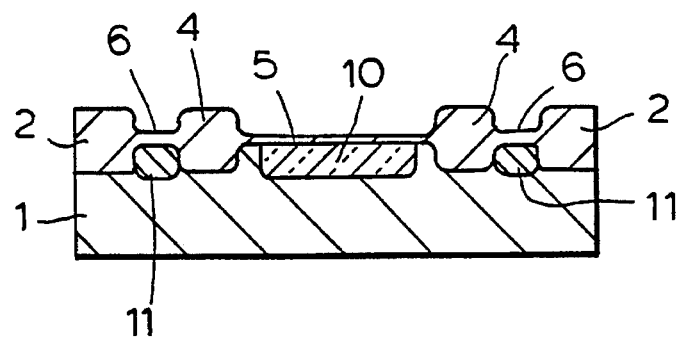

This semiconductor device is a CMOS gate array a part of whose unit cell is shown in FIGS. 4a and 4b. Since two gate electrodes 7, 7 are disposed adjacently, an oxide film 8 and a high-concentration impurity layer 12 are provided in T-shaped form. Also, since the whole NMOS area is enclosed with a thin oxide film 6 and a high-concentration impurity layer 11, it is possible to suppress the leakage current which flows between neighboring NMOS areas or between the NMOS area and an N-well.

Next, a fourth embodiment of the semiconductor device of the present invention will be described with reference to FIGS. 5a, 5b, 5c and 5d.

This semiconductor device is an NMOS transistor. On the surface of a P-type semiconductor substrate 1 of this transistor, there are provided, in the same way as the first embodiment, field oxide films 2, 3, 4, a gate oxide film 5, oxide films 6, 6 having film thickness almost equal to that of the gate oxide film 5, and a gate electrode 7. Further, between the field oxide films 3 and 4, a thin oxide film 8 with film thickness nearly equal to that of the gate oxide film is provided in an L-shaped form in the same manner as the first embodiment. $P^{++}$-type high-concentration impurity layers 11 and 12 are formed under the thin oxide films 6 and 8, respectively. Within the area surrounded by the field oxide films 3, 4 and the thin oxide film 8, $N^+$-type source-drain areas 9, 10 are formed using the gate electrode 7 as a mask. Here, this embodiment differs from the first embodiment in that $P^+$-type high-concentration impurity layers 13 are provided at end portions of the source-drain areas 9, 10, which are disposed in the direction of the gate width thereof. The impurity concentration of the $P^+$-type high-concentration impurity layer 13 is set so as to be higher than that of the semiconductor substrate 1 and lower than that of the $P^{++}$-type high-concentration impurity layer 12. The concentration of the $P^+$-type high-concentration impurity layer 13 is preferably determined considering the breakdown voltage of the PN junction with a value of approximately $10^{18}$ cm$^{-3}$ being preferable.

In the fourth embodiment, since the thin oxide film area of the gate electrode end portion is entirely covered with the high-concentration impurity layer, the deterrent effect of the embodiment against leakage currents between the source and drain can be further increased.

Next, a fifth embodiment of the semiconductor device of the present invention will be described with reference to FIGS. 6a, 6b, 6c and 6d.

This semiconductor device is an NMOS transistor in which, in the same way as the first embodiment, field oxide films 2, 3, 4, a gate oxide film 5, and a gate electrode 7 are provided on the surface of a P-type semiconductor substrate 1. Further, between the field oxide films 2 and 3 and between the field oxide films 2 and 4, there are provided thin oxide films 6 with a film thickness greater than that of the gate oxide film 5 and less than that of the field oxide films. Further, between the field oxide films 3 and 4, an oxide film 8 with an L-shaped form as in the first embodiment is provided with a thickness nearly equal to that of the thin oxide films 6. $P^{++}$-type high-concentration impurity layers 11 and 12 are provided under the thin oxide films 6 and 8, respectively. Within the area surrounded by the field oxide films 3, 4 and the oxide film 8, $N^+$-type source-drain areas 9, 10 are formed using the gate electrode 7 as a mask.

Accompanying the development of minute transistors in recent years, gate oxide films have also been reduced in scale, with oxide films having a thickness of not more than 10 nm coming into use. However, in a transistor having the structure of the first embodiment of the present invention, if the thin oxide films 6, 8 are formed with film thickness almost equal to the extremely thin film thickness of the gate oxide film 5, parasitic capacity is greatly increased in the overlapping areas of the gate electrode and the oxide films 6, 8. In contrast, if the oxide films 6, 8 are formed with a greater thickness than the gate oxide film 5 as shown in FIGS. 6a, 6b, 6c, 6d, the radiation resistance of the transistor will be improved without the ill effects of increased parasitic capacity. For this purpose, a suitable thickness of the oxide films 6, 8 is, for example, 20 nm in relation to a gate oxide film having a thickness of 10 nm.

With each of the above embodiments of the semiconductor device of the present invention, it is possible to sufficiently control the leakage current between the source and drain and between neighboring devices even in under exposure to radiation. Therefore, the semiconductor device illustrated in the above embodiments has a high level of resistance to radiation and is well-adapted for use in space.

What is claimed is:

1. A semiconductor device comprising:

a device area formed on a semiconductor substrate consisting of a gate insulating film, source-drain areas and a gate electrode having opposed ends; and a device separation area composed of a thick insulating film, a first thin insulating film with film thickness almost equal to that of said gate insulating film and a first high-concentration impurity layer provided under said first thin insulating film;

a second thin insulating film that partially overlaps said gate electrode at each end of said gate electrode and is connected with said first thin insulating film; and a second high-concentration impurity layer that is provided under said second thin insulating film so as to be separated from said source-drain areas.

2. The semiconductor device according to claim 1, further comprising:

a third high-concentration impurity layer provided between said second high-concentration impurity layer and said source-drain areas having impurity density higher than that of said semiconductor substrate and lower than that of said second high-concentration impurity layer.

3. The semiconductor device according to claim 1, wherein said first and second thin insulating films are formed thicker than said gate insulating film.

* * * * *